United States Patent
Fitzpatrick et al.

(10) Patent No.: US 11,257,546 B2
(45) Date of Patent: Feb. 22, 2022

(54) READING OF SOFT BITS AND HARD BITS FROM MEMORY CELLS

(71) Applicant: Micron Technology, Inc., Boise, ID (US)

(72) Inventors: James Fitzpatrick, Laguna Niguel, CA (US); Sivagnanam Parthasarathy, Carlsbad, CA (US); Patrick Robert Khayat, San Diego, CA (US); AbdelHakim S. Alhussien, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/869,488

(22) Filed: May 7, 2020

(65) Prior Publication Data

US 2021/0350856 A1    Nov. 11, 2021

(51) Int. Cl.
*G11C 16/26* (2006.01)
*G06F 3/06* (2006.01)
*G11C 16/04* (2006.01)

(52) U.S. Cl.
CPC ........... *G11C 16/26* (2013.01); *G06F 3/0604* (2013.01); *G06F 3/0659* (2013.01); *G06F 3/0673* (2013.01); *G11C 16/0483* (2013.01)

(58) Field of Classification Search
CPC .................................................... G11C 16/26
See application file for complete search history.

(56) References Cited

U.S. PATENT DOCUMENTS

| | | | |
|---|---|---|---|
| 5,864,504 A | 1/1999 | Tanzawa et al. | |
| 9,129,698 B2 | 9/2015 | Zeng et al. | |
| 9,947,401 B1 | 4/2018 | Navon et al. | |
| 10,008,273 B2 * | 6/2018 | Ray | G06F 11/1068 |
| 10,347,344 B2 * | 7/2019 | Malshe | G11C 16/0483 |
| 11,029,890 B1 | 6/2021 | Parthasarathy et al. | |
| 2008/0002468 A1 | 1/2008 | Hemink | |

(Continued)

OTHER PUBLICATIONS

Memory System Performance Enhancements using Measured Signal and Noise Characteristics of Memory Cells, U.S. Appl. No. 16/714,463, filed Dec. 13, 2019, James Fitzpatrick et al., Docketed New Case—Ready for Examination, Jan. 30, 2020.

(Continued)

*Primary Examiner* — Douglas King
(74) *Attorney, Agent, or Firm* — Greenberg Traurig

(57) ABSTRACT

A memory sub-system configured to execute a read command of a first type using a combine process to read soft bit data and hard bit data from memory cells. For example, a memory device is to: measure signal and noise characteristics of memory cells for the read command; calculate, based on the characteristics, an optimized voltage and two adjacent voltages that have offsets of a same amount from the optimized voltage; read the memory cells for hard bit data using the optimized voltage and for soft bit data using the two adjacent voltages; and transmit, to the processing device, a response including the hard bit data. The soft bit data can be selectively transmitted based on a classification determined from the characteristics. When a read command of a second type is executed, soft bit data is not read; and/or the signal and noise characteristics are not measured.

20 Claims, 6 Drawing Sheets

(56) References Cited

U.S. PATENT DOCUMENTS

| | | |
|---|---|---|
| 2008/0056008 A1 | 3/2008 | Aritome et al. |
| 2008/0192544 A1 | 8/2008 | Berman et al. |
| 2009/0063507 A1 | 3/2009 | Thompson |
| 2009/0144582 A1 | 6/2009 | Li et al. |
| 2009/0228701 A1 | 9/2009 | Lin |
| 2010/0027337 A1 | 2/2010 | Park |
| 2013/0070524 A1* | 3/2013 | Dutta ................ G11C 11/5642 365/185.03 |
| 2014/0022853 A1 | 1/2014 | Choi et al. |
| 2014/0068384 A1 | 3/2014 | Kwak et al. |
| 2015/0124533 A1 | 5/2015 | Zeng et al. |
| 2016/0300609 A1 | 10/2016 | Han et al. |
| 2017/0061832 A1 | 3/2017 | Ghosh et al. |
| 2018/0254888 A1 | 9/2018 | Monahan et al. |
| 2018/0330098 A1 | 11/2018 | Wyseur |
| 2018/0373598 A1 | 12/2018 | Mondello et al. |
| 2019/0043590 A1 | 2/2019 | Besinga et al. |
| 2020/0201608 A1 | 6/2020 | Wallbaum et al. |
| 2020/0273840 A1 | 8/2020 | Elsherbini et al. |

OTHER PUBLICATIONS

Dynamic Adjustment of Data Integrity Operations of a Memory System Based on Error Rate Classification, U.S. Appl. No. 16/807,056, filed Mar. 2, 2020, Patrick Khayat et al., Docketed New Case—Ready for Examination, Apr. 14, 2020.

Read Soft Bits Through Boosted Modulation Following Reading Hard Bits, U.S. Appl. No. 16/869,492, Sivagnanam Parthasarathy et al., Application Undergoing Preexam Processing, May 7, 2020.

Intelligent Proactive Responses to Operations to Read Data From Memory Cells, U.S. Appl. No. 16/869,494, Sivagnanam Parthasarathy et al., Application Undergoing Preexam Processing, May 7, 2020.

Adaptive and/or Iterative Operations in Executing a Read Command to Retrieve Data From Memory Cells, U.S. Appl. No. 16/807,059, filed Mar. 2, 2020, James Fitzpatrick et al., Docketed New Case—Ready for Examination, Mar. 31, 2020.

Self Adapting Iterative Read Calibration to Retrieve Data From Memory Cells, U.S. Appl. No. 16/807,061, filed Mar. 2, 2020, Abdelhakim Alhussien et al., Docketed New Case—Ready for Examination, Mar. 31, 2020.

Compound Feature Generation in Classification of Error Rate of Data Retrieved From Memory Cells, U.S. Appl. No. 16/807,063, filed Mar. 2, 2020, Sivagnanam Parthasarathy et al., Docketed New Case—Ready for Examination, Mar. 31, 2020.

Classification of Error Rate of Data Retrieved From Memory Cells, U.S. Appl. No. 16/807,065, filed Mar. 2, 2020, Sivagnanam Parthasarathy et al., Docketed New Case—Ready for Examination, Mar. 30, 2020.

International Search Report and Written Opinion, PCT/US2020/063788, dated Mar. 26, 2021.

Memory System Performance Enhancements using Measured Signal and Noise Characteristics of Memory Cells, U.S. Appl. No. 16/714,463, filed Dec. 13, 2019, James Fitzpatrick et al., Non Final Action dated Feb. 22, 2021.

Read Soft Bits Through Boosted Modulation Following Reading Hard Bits, U.S. Appl. No. 16/869,492, filed May 7, 2020, Sivagnanam Parthasarathy., Docketed New Case—Ready for Examination, May 27, 2020.

Intelligent Proactive Responses to Operations to Read Data From Memory Cells, U.S. Appl. No. 16/869,494, filed May 7, 2020, Sivagnanam Parthasarathy et al., Notice of Allowance Mailed—Application Received in Office of Publications, dated Mar. 10, 2021.

Adaptive and/or Iterative Operations in Executing a Read Command to Retrieve Data From Memory Cells, U.S. Appl. No. 16/807,059, filed Mar. 2, 2020, James Fitzpatrick et al., Non Final Action dated Apr. 26, 2021.

Self Adapting Iterative Read Calibration to Retrieve Data From Memory Cells, U.S. Appl. No. 16/807,061, filed Mar. 2, 2020, Abdelhakim Alhussien et al., Notice of Allowance Mailed—Application Received in Office of Publications, dated Nov. 13, 2020.

Compound Feature Generation in Classification of Error Rate of Data Retrieved From Memory Cells, U.S. Appl. No. 16/807,063, filed Mar. 2, 2020, Sivagnanam Parthasarathy et al., Publications—Issue Fee Payment Verified, May 3, 2021, Compound Feature Generation in Classification of Error Rate of Data Retrieved from Memory Cells, U.S. Appl. No. 17/313,944, filed May 6, 2021, Sivagnanam Parthasarathy et al., Application Undergoing Preexam Processing, May 6, 2021.

* cited by examiner

READING OF SOFT BITS AND HARD BITS FROM MEMORY CELLS

FIELD OF THE TECHNOLOGY

At least some embodiments disclosed herein relate to memory systems in general, and more particularly, but not limited to memory systems configured to execute read commands using a combined process for reading soft bit data and hard bit data from memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
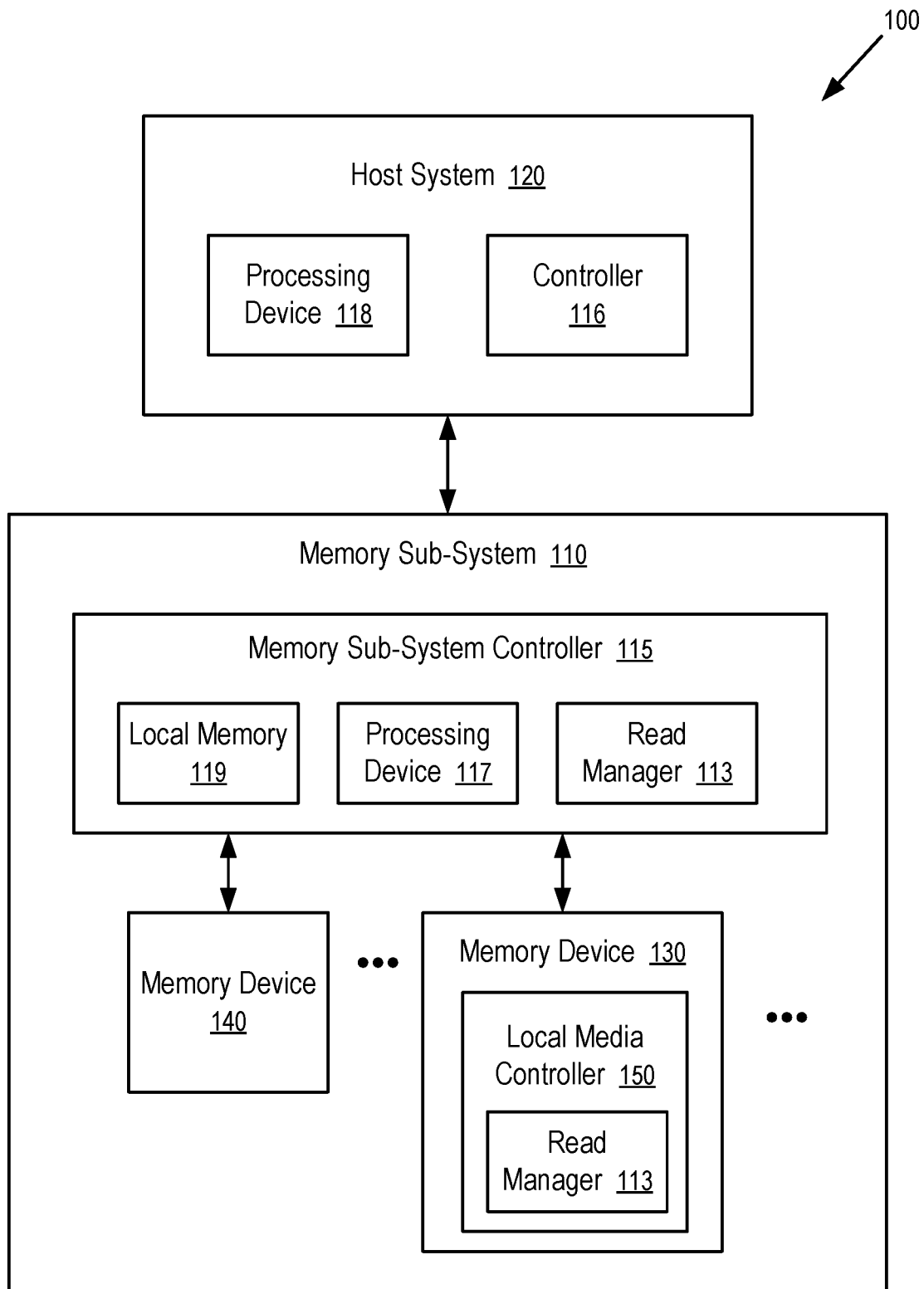
FIG. 1 illustrates an example computing system having a memory sub-system in accordance with some embodiments of the present disclosure.

At least some aspects of the present disclosure are directed to a memory sub-system configured to execute a read command using a combined process to read soft bit data and hard bit data from memory cells. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundant information to facilitate error detection and recovery. When data encoded with redundant information is stored in a memory sub-system, the memory sub-system can detect errors in raw, encoded data retrieved from the memory sub-system and/or recover the original, non-encoded data that is used to generated encoded data for storing in the memory sub-system. The recovery operation can be successful (or have a high probability of success) when the raw, encoded data retrieved from the memory sub-system contains less than a threshold amount of errors, or the bit error rate in the encoded data is lower than a threshold. For example, error detection and data recovery can be performed using techniques such as Error Correction Code (ECC), Low-Density Parity-Check (LDPC) code, etc.

When the encoded data retrieved from the memory cells of the memory sub-system has too many errors for successful decoding, the memory sub-system may retry the execution of the read command with adjusted parameters for reading the memory cells. However, it is inefficient to search for a set of parameters through multiple read retry with multiple rounds of calibration, reading, decoding failure, and retry, until the encoded data retrieved from the memory cells can be decoded into error free data. For example, blind searching for the optimized read voltages is inefficient. For example, one or more commands being injected between retry reads can lead to long latency for recovering data from errors.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

At least some aspects of the present disclosure address the above and other deficiencies by implementing an efficient read command. In response to the read command, a memory device calibrates the read voltage(s) based on signal and noise characteristics measured for memory cells, read memory cells to obtain hard bit data using the calibrated read voltage(s), and read memory cells to obtain soft bit data using further read voltage(s) that have predetermined offset from the calibrated read voltage(s).

Preferably, the operations of reading the hard bit data and reading the soft bit data are scheduled together during the execution of the read command to minimize the time required to obtain the soft bit data and/or to avoid delay that can be caused by processing a separate read command, or by intervening operations on the memory cells.

Optionally, the signal and noise characteristics measured for memory cells are used to evaluate the quality of the hard bit data retrieved using the calibrated read voltage(s). Based on the evaluated quality of the hard bit data, the memory device may selectively report the soft bit data in responding to the read command.

The hard bit data retrieved from the memory cell using the calibrated/optimized read voltage can be decoded using an error detection and data recovery technique, such as Error Correction Code (ECC), Low-Density Parity-Check (LDPC) code, etc. When the error rate in the hard bit data is high, the soft bit data, retrieved from the memory cell using read voltages with predetermined offsets from the calibrated/optimized read voltage, can be used to assist the decoding of the hard bit data. When the soft bit data is used, the error recovery capability is improved in decoding the hard bit data.

Optionally, a controller of a memory sub-system can initially send a command to a memory device to read hard bit data with calibrated read voltage; and in response to a failure in the decoding of the hard bit data, the controller can further send a command to the memory device to read the corresponding soft bit data. Such an implementation is efficient when the likelihood of a failure in decoding the hard bit data without soft bit data is lower than a threshold. However, when the likelihood is above the threshold, the overhead of sending the separate command becomes disadvantageous.

When the likelihood of using soft bit data is above a threshold, it is advantageous to transmit a single command to the memory device to cause the memory device to read the soft bit data and the hard bit data together. Further, the memory device can use the signal and noise characteristics of the memory cells to predict whether the soft bit data is likely to be used by the controller. If the use of the soft bit data is predicted, the memory device transmits the hard bit data and the soft bit data to the controller; otherwise, the memory device can skip the transmission of the soft bit data. Optionally, the memory device can cache the soft bit data for a period of time, such that when the controller requests for the soft bit data, the memory device can provide the soft bit data without further reading the memory cells.

For example, during the calibration operation, the memory device can measure the signal and noise characteristics of the memory cells and use the measurements to calculate an optimized/calibrated read voltage for reading the memory cells. Once the optimized/calibrated read voltage is obtained, the memory device reads the memory cells to obtain the hard bit data. Subsequently, the memory device applies a voltage at a predetermined offset below the optimized/calibrated read voltage to retrieve a set of data, and applies a voltage at the predetermined offset above the optimized/calibrated read voltage to retrieve another set of data. The logic operation of XOR (exclusive or) of the two sets of data at the both sides of the offset from the optimized/calibrated read voltage provides the indication of whether the memory cells provide the same reading at the offset locations around the optimized/calibrated read voltage. The result of the XOR operation can be used as soft bit data for decoding the hard bit data read using the optimized/calibrated read voltage. In some implementations, a larger offset can be used to read another set of soft bit data indicating whether the memory cells provide the same reading at the locations according to the larger offset around the optimized/calibrated read voltage.

When the memory cells are subjected to the optimized/calibrated read voltage for the read of hard bit data, boosted modulation of the currently applied read voltage to an offset location to read the soft bit data causes minimal delay in providing a response from the memory device to the component.

For example, in response to a read command from a controller of the memory sub-system, a memory device of the memory sub-system performs an operation to calibrate a read voltage of memory cells. The calibration is performed by measuring signal and noise characteristics through reading the memory cells at a number of voltage levels that are near an estimated location of the optimized read voltage. An optimized read voltage can be calculated based on statistical data of the results generated from reading the memory cells at the voltage levels. For example, the statistical data can include and/or can be based on counts measured by calibration circuitry at the voltage levels. Optionally, such signal and noise characteristics can be measured for sub-regions in parallel to reduce the total time for measuring the signal and noise characteristics. The statistical data of the results generated from reading the memory cells at the voltage levels can be used to predict whether the decoding of the hard bit data retrieved using the optimized read voltage is likely to require the use of soft bit data for successful decoding. Thus, the transmission of the soft bit data can be performed selectively based on the prediction.

For example, a predictive model can be generated through machine learning to estimate or evaluate the quality of data that can be retrieved from a set of memory cells using the calibrated/optimized read voltage(s). The predictive model can use features calculated from the measured signal and noise characteristics of the memory cells as input to generate a prediction. The transmission of the soft bit data can be selectively skipped based on the prediction.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130,140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 and/or a memory device 130 can include a read manager 113 configured to implement a read command that instructs to the memory device to use a combined process to reading soft bits and hard bits from memory cells. In some embodiments, the controller 115 in the memory sub-system 110 includes at least a portion of the read manager 113. In other embodiments, or in combination, the controller 116 and/or the processing device 118 in the host system 120 includes at least a portion of the read manager 113. For example, the controller 115, the controller 116, and/or the processing device 118 can include logic circuitry implementing the read manager 113. For example, the controller 115, or the processing device 118 (processor) of the host system 120, can be configured to execute instructions stored in memory for performing the operations of the read manager 113 described herein. In some embodiments, the read manager 113 is implemented in an integrated circuit chip disposed in the memory sub-system 110. In other embodiments, the read manager 113 can be part of firmware of the memory sub-system 110, an operating system of the host system 120, a device driver, or an application, or any combination therein.

For example, the read manager 113 implemented in the controller 115 can transmit a particular read command that is configured to request the memory device 130 to read soft bit data in addition to reading hard bit data. In response to such a read command, the read manager 113 implemented in the memory device 130 is configured to measure signal and noise characteristics, determine an optimized read voltage from the measured signal and noise characteristics, read the hard bit data by applying the optimized read voltage, and read the soft bit data by applying read voltages that are centered at the optimized read voltage with a predetermined offset.

Optionally, the read manager 113 is further configured to classify the error rate in the hard bit data using the measured signal and noise characteristics and selectively transmit the soft bit data to the controller 115 as a response to the read command. The read manager 113 can optionally accept a response from the memory device 130 that does not include the soft bit data.

Optionally, the memory device 130 is configured to cache the soft bit data for a period of time. When the read manager 113 subsequently requests the memory device 130 to transmit the soft bit data, the memory component can transmit the soft bit data without further reading the memory cells.

Figure 2:
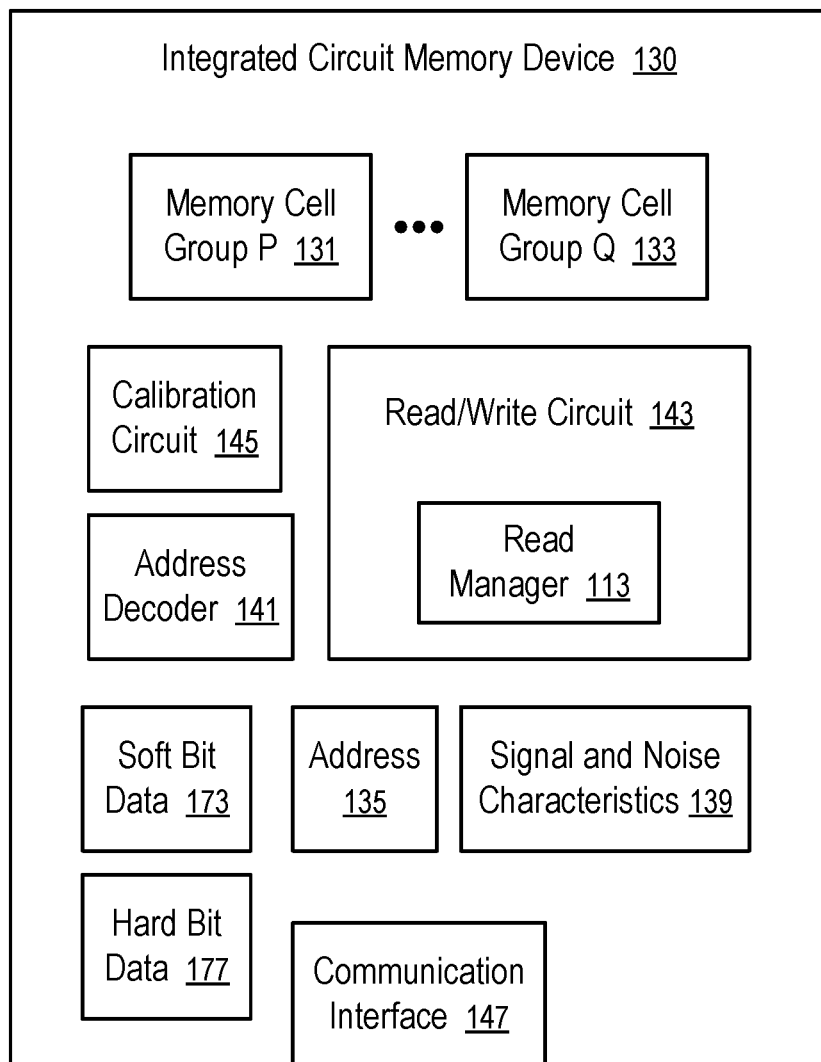
FIG. 2 illustrates an integrated circuit memory device having a calibration circuit configured to measure signal and noise characteristics according to one embodiment.

FIG. 2 illustrates an integrated circuit memory device 130 having a calibration circuit 145 configured to measure signal and noise characteristics according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131, . . . , 133 can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve both hard bit data 177 and soft bit data 173 from the memory address 135, and provide at least the hard bit data 177 as a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the hard bit data 177 and the soft bit data 173 of memory cells at the address 135.

The integrated circuit memory device 130 has a calibration circuit 145 configured to determine measurements of signal and noise characteristics 139 of memory cells in a group (e.g., 131, . . . , or 133). For example, the statistics of memory cells in a group or region that has a particular state at one or more test voltages can be measured to determine the signal and noise characteristics 139. Optionally, the signal and noise characteristics 139 can be provided by the memory device 130 to the controller 115 of a memory sub-system 110 via the communication interface 147.

In at least some embodiments, the calibration circuit 145 determines the optimized read voltage(s) of the group of memory cells based on the signal and noise characteristics 139. In some embodiments, the signal and noise characteristics 139 are further used in the calibration circuit 145 to determine whether the error rate in the hard bit data 177 is sufficiently high such that it is preferred to decode the hard bit data 177 in combination with the soft bit data 173 using a sophisticated decoder. When the use of the soft bit data 173 is predicted, based on the prediction/classification of the error rate in the hard bit data 177, the read manager 113 can transmit both the soft bit data 173 and the hard bit data 177 to the controller 115 of the memory sub-system 110.

For example, the calibration circuit 145 can measure the signal and noise characteristics 139 by reading different responses from the memory cells in a group (e.g., 131, . . . , 133) by varying operating parameters used to read the memory cells, such as the voltage(s) applied during an operation to read data from memory cells.

For example, the calibration circuit 145 can measure the signal and noise characteristics 139 on the fly when executing a command to read the hard bit data 177 and the soft bit data 173 from the address 135. Since the signal and noise characteristics 139 is measured as part of the operation to read the hard bit data 177 from the address 135, the signal and noise characteristics 139 can be used in the read manager 113 with reduced or no penalty on the latency in the execution of the command to read the hard bit data 177 from the address 135.

The read manager 113 of the memory device 130 is configured to use the signal and noise characteristics 139 to determine the voltages used to read memory cells identified by the address 135 for both hard bit data and soft bit data and to determine whether to transmit the soft bit data to the memory sub-system controller 115.

For example, the read manager 113 can use a predictive model, trained via machine learning, to predict the likelihood of the hard bit data 177 retrieved from a group of memory cells (e.g., 131 or 133) failing a test of data integrity. The prediction can be made based on the signal and noise characteristics 139. Before the test is made using error-correcting code (ECC) and/or low-density parity-check (LDPC) code, or even before the hard bit data 177 is transferred to a decoder, the read manager 113 uses the signal and noise characteristics 139 to predict the result of the test. Based on the predicted result of the test, the read manager 113 determines whether to transmit the soft bit data to the memory sub-system controller 115 in a response to the command.

For example, if the hard bit data 177 is predicted to decode using a low-power decoder that uses hard bit data 177 without using the soft bit data 173, the read manager 113 can skip the transmission of the soft bit data 173 to the memory sub-system controller 115; and the read manager 113 provides the hard bit data 177, read from the memory cells using optimized read voltages calculated from the signal and noise characteristics 139, for decoding by the low-power decoder. For example, the low-power decoder can be implemented in the memory sub-system controller 115. Alternatively, the low-power decoder can be implemented in the memory device 130; and the read manager 113 can provide the result of the lower-power decoder to the memory sub-system controller 115 as the response to the received command.

For example, if the hard bit data 177 is predicted to fail in decoding in the low-power decoder, but can be decoded using a high-power decoder that uses both hard bit data and soft bit data, the read manager 113 can decide to provide both the hard bit data 177 and the soft bit data 173 for decoding by the high-power decoder. For example, the high-power decoder can be implemented in the controller 115. Alternatively, the high-power decoder can be implemented in the memory device 130.

For example, a memory sub-system 110 can have multiple decoders, such as a low-power hard bit decoder, an intermediate-power hard bit decoder, a high-power soft bit and hard bit decoder. A lower power decoder consumes less energy and has less error correction capability than a higher power decoder. Some implementations use few decoders, such as a hard bit decoder and a soft bit decoder that decodes soft bit data 173 and hard bit data 177 with more power consumption and better error correction capability than the hard bit decoder. The selection of a decoder can be based on the availability of decoders in the memory sub-system 110, the capability and/or power consumption of the available decoders in the memory sub-system 110, and the quality of the hard bit data 177 and/or soft bit data 173 (e.g., bit error rate, or bit error count) estimated using the signal and noise characteristics 139.

Optionally, if the hard bit data 177 is predicted to fail in decoding in decoders available in the memory sub-system 110, the read manager 113 can decide to skip transmitting the hard bit data 177 to the memory sub-system controller 115, initiate a read retry immediately, such that when the memory sub-system controller 115 requests a read retry, at least a portion of the read retry operations is performed to reduce the time for responding to the request from the memory sub-system controller 115 for a read retry. For example, during the read retry, the read manager 113 instructs the calibration circuit 145 to perform a modified calibration to obtain a new set of signal and noise characteristics 139, which can be further used to determine improved read voltages.

The data from the memory cells identified by the address (135) can include hard bit data 177 and soft bit data 173. The hard bit data 177 is retrieved using optimized read voltages.

The hard bit data 177 identifies the states of the memory cells that are programmed to store data and subsequently detected in view of changes caused by factors, such as charge loss, read disturb, cross-temperature effect (e.g., write and read at different operating temperatures), etc. The soft bit data 173 is obtained by reading the memory cells using read voltages centered at each optimized read voltage with a predetermined offset from the center, optimized read voltage. The XOR of the read results at the read voltages having the offset indicates whether the memory cells provide different read results at the read voltages having the offset. The soft bit data 173 can include the XOR results. In some instances, one set of XOR results is obtained based on a smaller offset; and another set of XOR results is obtained based on a larger offset. In general, multiple sets of XOR results can be obtained for multiple offsets, where each respective offset is used to determine a lower read voltage and a higher read voltage such that both the lower and higher read voltages have the same respective offset from an optimized read voltage to determine the XOR results.

Figure 3:
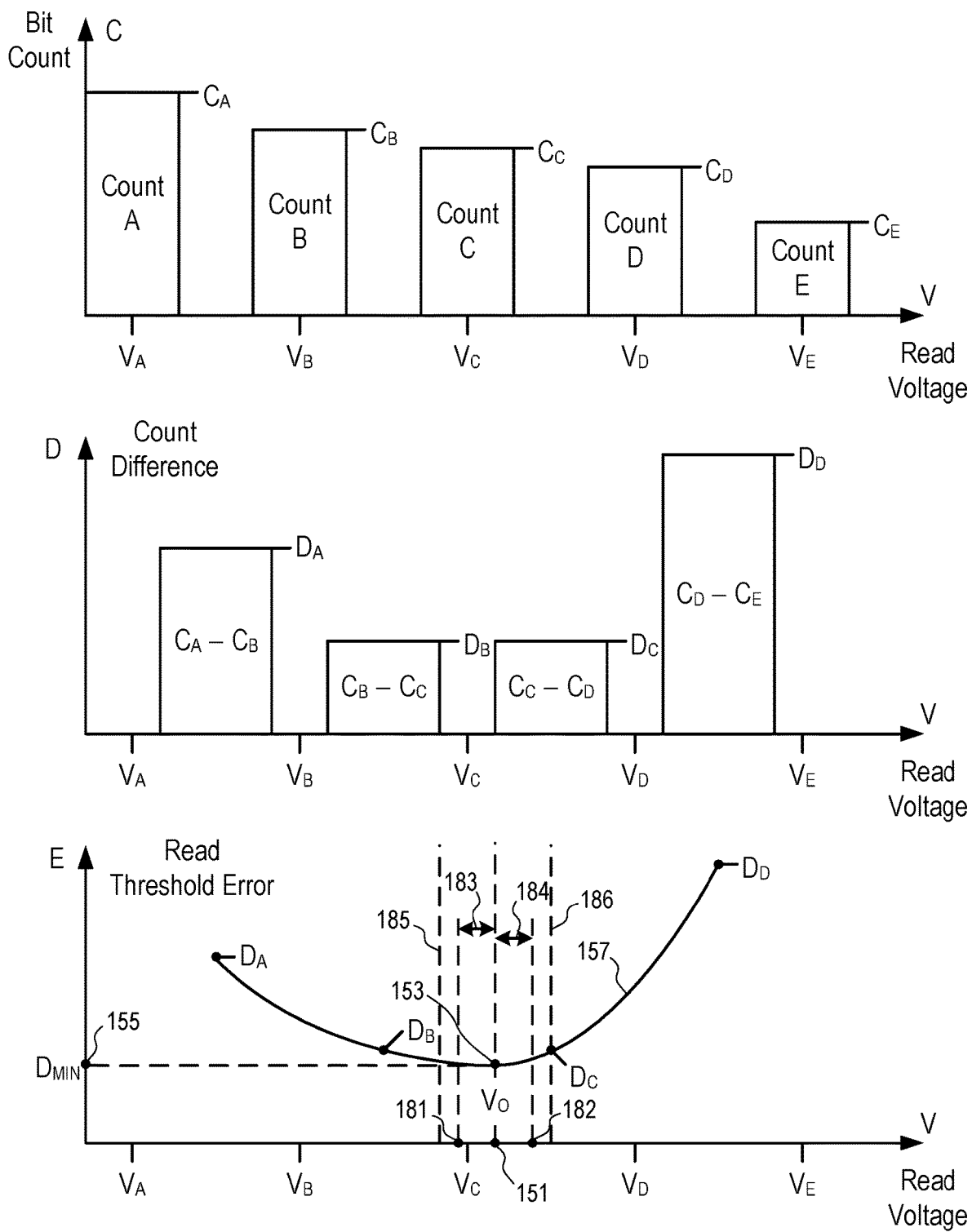
FIG. 3 shows an example of measuring signal and noise characteristics to improve memory operations according to one embodiment.

FIG. 3 shows an example of measuring signal and noise characteristics 139 to improve memory operations according to one embodiment.

In FIG. 3, the calibration circuit 145 applies different read voltages $V_A$, $V_B$, $V_C$, $V_D$, and $V_E$ to read the states of memory cells in a group (e.g., 131, ..., or 133). In general, more or less read voltages can be used to generate the signal and noise characteristics 139.

As a result of the different voltages applied during the read operation, a same memory cell in the group (e.g., 131, ..., or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ can be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 145 can measure the bit counts by applying the read voltages $V_A$, $V_B$, $V_C$, $V_D$, and $V_E$ one at a time on the group (e.g., 131, ..., or 133) of memory cells.

Alternatively, the group (e.g., 131, ..., or 133) of memory cells can be configured as multiple subgroups; and the calibration circuit 145 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, ..., or 133). Thus, the time duration of obtaining the counts $C_A$, $C_B$, $C_C$, $C_D$, and $C_E$ can be reduced.

In some embodiments, the bit counts $C_A$, $C_B$, $C_C$, $C_D$, and $C_E$ are measured during the execution of a command to read the data from the address 135 that is mapped to one or more memory cells in the group (e.g., 131, ..., or 133). Thus, the controller 115 does not need to send a separate command to request for the signal and noise characteristics 139 that is based on the bit counts $C_A$, $C_B$, $C_C$, $C_D$, and $C_E$.

The differences between the bit counts of the adjacent voltages are indicative of the errors in reading the states of the memory cells in the group (e.g., 133, ..., or 133).

For example, the count difference $D_A$ is calculated from $C_A$-$C_B$, which is an indication of read threshold error introduced by changing the read voltage from $V_A$ to $V_B$.

Similarly, $D_B=C_B-C_C$; $D_C=C_C-C_D$; and $D_D=C_D-C_E$.

The curve 157, obtained based on the count differences $D_A$, $D_B$, $D_C$, and $D_D$, represents the prediction of read threshold error E as a function of the read voltage. From the curve 157 (and/or the count differences), the optimized read voltage $V_O$ can be calculated as the point 153 that provides the lowest read threshold error $D_{MIN}$ on the curve 157.

In one embodiment, the calibration circuit 145 computes the optimized read voltage $V_O$ and causes the read/write circuit 143 to read the data from the address 135 using the optimized read voltage $V_O$.

Alternatively, the calibration circuit 145 can provide, via the communication interface 147 to the controller 115 of the memory sub-system 110, the count differences $D_A$, $D_B$, $D_C$, and $D_D$ and/or the optimized read voltage $V_O$ calculated by the calibration circuit 145.

FIG. 3 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimized read voltage, where the test voltages in each set of statistical data are configured in the vicinity of the expected location of the corresponding optimized read voltage. Thus, the signal and noise characteristics 139 measured for a memory cell group (e.g., 131 or 133) can include multiple sets of statistical data measured for the multiple threshold voltages respectively.

For example, the controller 115 can instruct the memory device 130 to perform a read operation by providing an address 135 and at least one read control parameter. For example, the read control parameter can be a suggested read voltage.

The memory device 130 can perform the read operation by determining the states of memory cells at the address 135 at a read voltage and provide the data according to the determined states.

During the read operation, the calibration circuit 145 of the memory device 130 generates the signal and noise characteristics 139. The data and the signal and noise characteristics 139 are provided from the memory device 130 to the controller 115 as a response. Alternatively, the processing of the signal and noise characteristics 139 can be performed at least in part using logic circuitry configured in the memory device 130. For example, the processing of the signal and noise characteristics 139 can be implemented partially or entirely using the processing logic configured in the memory device 130. For example, the processing logic can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

The signal and noise characteristics 139 can be determined based at least in part on the read control parameter. For example, when the read control parameter is a suggested read voltage for reading the memory cells at the address 135, the calibration circuit 145 can compute the read voltages $V_A$, $V_B$, $V_C$, $V_D$, and $V_E$ that are in the vicinity of the suggested read voltage.

The signal and noise characteristics 139 can include the bit counts $C_A$, $C_B$, $C_C$, $C_D$, and $C_E$. Alternatively, or in combination, the signal and noise characteristics 139 can include the count differences $D_A$, $D_B$, $D_C$, and $D_D$.

Optionally, the calibration circuit 145 uses one method to compute an optimized read voltage $V_O$ from the count differences $D_A$, $D_B$, $D_C$, and $D_D$; and the controller 115 uses another different method to compute the optimized read voltage $V_O$ from the signal and noise characteristics 139 and optionally other data that is not available to the calibration circuit 145.

When the calibration circuit 145 can compute the optimized read voltage $V_O$ from the count differences $D_A$, $D_B$, $D_C$, and $D_D$ generated during the read operation, the signal and noise characteristics can optionally include the optimized read voltage $V_O$. Further, the memory device 130 can use the optimized read voltage $V_O$ in determining the hard bit data in the data from the memory cells at the address 135. The soft bit data in the data can be obtained by reading the memory cells with read voltages that are a predetermined offset away from the optimized read voltage $V_O$. Alternatively, the memory device 130 uses the controller-specified read voltage provided in the read control parameter in reading the data.

The controller 115 can be configured with more processing power than the calibration circuit 145 of the integrated circuit memory device 130. Further, the controller 115 can have other signal and noise characteristics applicable to the memory cells in the group (e.g., 133, . . . , or 133). Thus, in general, the controller 115 can compute a more accurate estimation of the optimized read voltage $V_O$ (e.g., for a subsequent read operation, or for a retry of the read operation).

In general, it is not necessary for the calibration circuit 145 to provide the signal and noise characteristics 139 in the form of a distribution of bit counts over a set of read voltages, or in the form of a distribution of count differences over a set of read voltages. For example, the calibration circuit 145 can provide the optimized read voltage $V_O$ calculated by the calibration circuit 145, as signal and noise characteristics 139.

The calibration circuit 145 can be configured to generate the signal and noise characteristics 139 (e.g., the bit counts, or bit count differences) as a byproduct of a read operation. The generation of the signal and noise characteristics 139 can be implemented in the integrated circuit memory device 130 with little or no impact on the latency of the read operation in comparison with a typical read without the generation of the signal and noise characteristics 139. Thus, the calibration circuit 145 can determine signal and noise characteristics 139 efficiently as a byproduct of performing a read operation according to a command from the controller 115 of the memory sub-system 110.

In general, the calculation of the optimized read voltage $V_O$ can be performed within the memory device 130, or by a controller 115 of the memory sub-system 110 that receives the signal and noise characteristics 139 as part of enriched status response from the memory device 130.

The hard bit data 177 can be obtained by applying the optimized read voltage $V_O$ on the group of memory cells and determining the state of the memory cells while the memory cells are subjected to the optimized read voltages $V_O$.

The soft bit data 173 can be obtained by applying the read voltages 181 and 182 that are offset from the optimized read voltage $V_O$ with a predetermined amount. For example, the read voltage 181 is at the offset 183 of the predetermined amount lower from the optimized read voltage $V_O$; and the read voltage 182 is at the offset 184 of the same predetermined amount higher from the optimized read voltage $V_O$. A memory cell subjected to the read voltage 181 can have a state that is different from the memory cell subjected to the read voltage 182. The soft bit data 173 can include or indicate the XOR result of the data read from the memory cell using the read voltages 181 and 182. The XOR result shows whether the memory cell subjected to the read voltage 181 has the same state as being to the read voltage 182.

Figure 4:
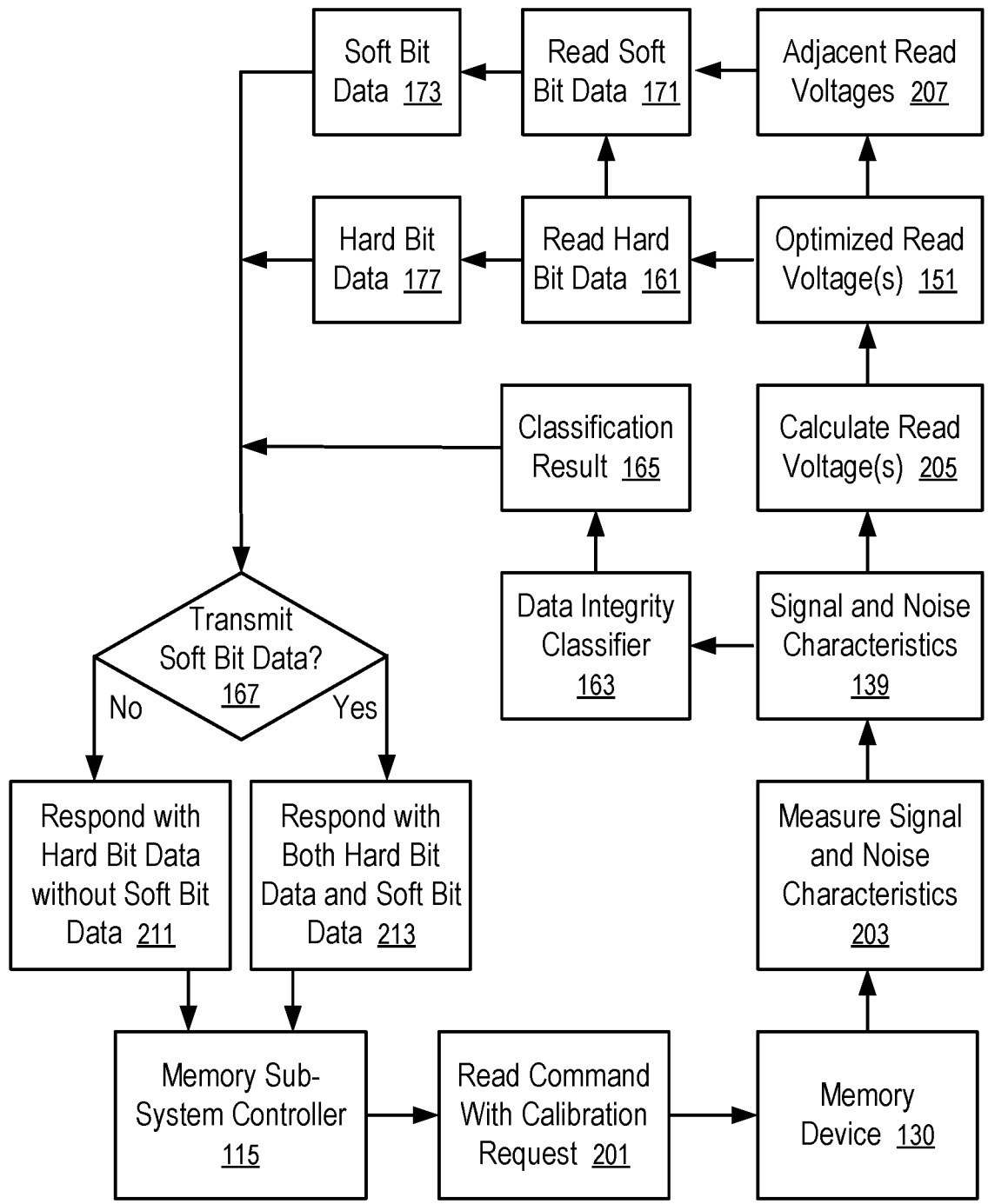
FIG. 4 illustrates a combined process to read soft bit data and hard bit data from memory cells according to one embodiment.

FIG. 4 illustrates a combined process to read soft bit data and hard bit data from memory cells according to one embodiment. For example, a command to invoke the combined process can be implemented in a memory sub-system 110 of FIG. 1 having an integrated circuit memory device 130 of FIG. 2, using the signal and noise characteristics 139 measured according to FIG. 3.

In FIG. 4, a memory sub-system controller 115 transmits to a memory device 130 a read command 201 that requires the memory device 130 to perform read calibration. The memory sub-system controller 115 can send other read commands that do not require the memory device 130 to preform read calibration.

In response to the read command 201, the memory device 130 measures 203 signal and noise characteristics 139 using its calibration circuit 145. For example, the signal and noise characteristics 139 can include, and/or be based on, the bit counts $C_A$, $C_B$, $C_C$, $C_D$, and $C_E$ to determine the optimized read voltage $V_O$ near the estimated location $V_C$. For example, the signal and noise characteristics 139 can include the count differences $D_A$, $D_B$, $D_C$, and $D_D$.

Based on the signal and noise characteristics 139, the memory device 130 calculates 205 voltages for reading data from the memory cells, including the optimized read voltage $V_O$ 151 for reading 161 the hard bit data 177 and the adjacent read voltages 207 (e.g., 181 and 182) for reading 171 the soft bit data 173.

As illustrated in FIG. 3, the adjacent read voltages (e.g., 181 and 182) are determined based on offsets (e.g., 183 and 184) of the same amount from the optimized read voltage $V_O$ 151.

In some implementations, multiple offset amounts are used to generate different sets of offsets to generate soft bit data 173 corresponding to the multiple amounts. For example, further adjacent read voltages (e.g., 185 and 186), centered at the optimized read voltage $V_O$ 151 with offsets larger than the offsets 183 and 184, can be used to read a second set of data for the soft bit data 173.

FIG. 4 illustrates a configuration in which the memory device 130 reads the memory cells at the optimized read voltage 151 and then adjusts (e.g., via boosted modulation) the read voltage to the adjacent read voltages 207 to read the soft bit data 173. In alternative configurations, the memory device 130 can read the memory cells using the calculated read voltages in a different order. For example, the memory device 130 can read the memory cells at the voltage 181, read the memory cells again via boosted modulation the applied voltage to $V_O$, and further read the memory cells via boosted modulation to the voltage 182. The results of the read operations can be organized as the hard bit data 177 and the soft bit data 173. In another sequence, the memory device 130 reads at the optimized read voltage $V_O$, then adjusts via boosted modulation to voltage 181 and to voltage 182.

While the memory device 130 reads the hard bit data 177 and the soft bit data 173, a data integrity classifier 163 is configured to concurrently, or in parallel, generate a classification result 165 based on the signal and noise characteristics 139. The classification result 163 indicates whether or not the error rate in the hard bit data 177 requires the transmission of the soft bit data 173. If so, the memory device 130 responds 213 to the read command with both the hard bit data 177 and the soft bit data 173; otherwise, the memory device 130 responds 211 to the read command 201 with hard bit data without soft bit data.

After receiving the hard bit data 177 without the soft bit data 173, the memory sub-system controller 115 can optionally request the memory device 130 to transmit the soft bit data 173. In response to such a request, the memory device 130 can transmit the soft bit data 173 without reading the memory cells again using the adjacent read voltages 207.

Optionally, the memory device 130 can provide at least a portion of the signal and noise characteristics 139 as part of the response (e.g., 211 or 213) to the read command 201. Alternatively, the memory device 130 can provide the classification result 165 as part of the response (e.g., 211 or 213) to the read command 201; and subsequently, the memory sub-system controller 115 can optionally request the memory device 130 to provide the signal and noise characteristics 139.

For example, the hard bit data 177 retrieved from the memory cells of the memory device is in an encoded format that allows error detection and recovery using techniques such as Error Correction Code (ECC), Low-Density Parity-Check (LDPC) code. The signal and noise characteristics 139 can be provided as input to the data integrity classifier 163 to evaluate the likelihood of the hard bit data 177 having too many errors for success decoding by some or all the processing paths/modules/options in the memory sub-system 110.

For example, the memory sub-system 110 can include a low power ECC, a full power ECC, an LDPC decoder that does not use soft bit data 173, and/or an LDPC decoder that uses both the hard bit data 177 and soft bit data 173 in decoding. In general, available paths/modules/options for decoding in a memory sub-system 110 are not limited to such the examples; different processing paths/modules/options can be implemented; and the different processing paths/modules/options have different power consumption levels, different capabilities in recovering error-free original/non-encoded data from the retrieve raw data, and/or different processing latency.

The data integrity classifier 163 can be trained (e.g., through machine learning) to predict the likelihood of data integrity failure in decoding the hard bit data 177, with or without the soft bit data 173, based on the associated signal and noise characteristics 139.

For example, the likelihood of data integrity failure can be in the form of an estimated bit error rate in the hard bit data 177.

For example, the likelihood of data integrity failure can be in the form of a prediction of whether the hard bit data 177 can be successfully decoded (e.g., via ECC or LDPC) by any of the processing paths/modules/options for error detection and recovery and if so, which of the processing paths/modules/options is or are predicted to be able to successfully decode the hard bit 177 having the associated signal and noise characteristics 139, and/or whether the soft bit data 173 is to be used for a successful decoding operation.

For example, some of the processing paths/modules/options for error detection and recovery are implemented in the memory device 130; and some of the processing paths/modules/options are implemented in the controller 115. Optionally, when the classification result 165 indicates that the hard bit data 177 can be decoded using a decoder implemented in the memory device 130, the memory device 130 can optionally decode the hard bit data 177 and transmit the result of the decoder to the memory sub-system controller 115; and the transmission of the hard bit data 177 can also be skipped in such a situation. Optionally, when the classification result 165 indicates that the hard bit data 177 and the soft bit data 173 cannot be decoded successfully using any decoder implemented in the memory subsystem 110, the memory device 130 can optionally skip the transmission of the hard bit data 177 and/or the soft bit data 173 in such a situation.

Based on the predicted likelihood of data integrity failure, the read manager 113 of the memory device 130 can determine 167 whether or not to transmit the soft bit data 173 to the memory sub-system controller 115.

The processing logic of at least a portion of the data integrity classifier 163, the calibration circuit 145, and/or the read manager 113 can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

A read manager 113 can include a data integrity classifier 163. The data integrity classifier 163 implemented in the memory device 130 can be used in controlling the transmission of the soft bit data 173 and/or the hard bit data 177.

Figure 5:
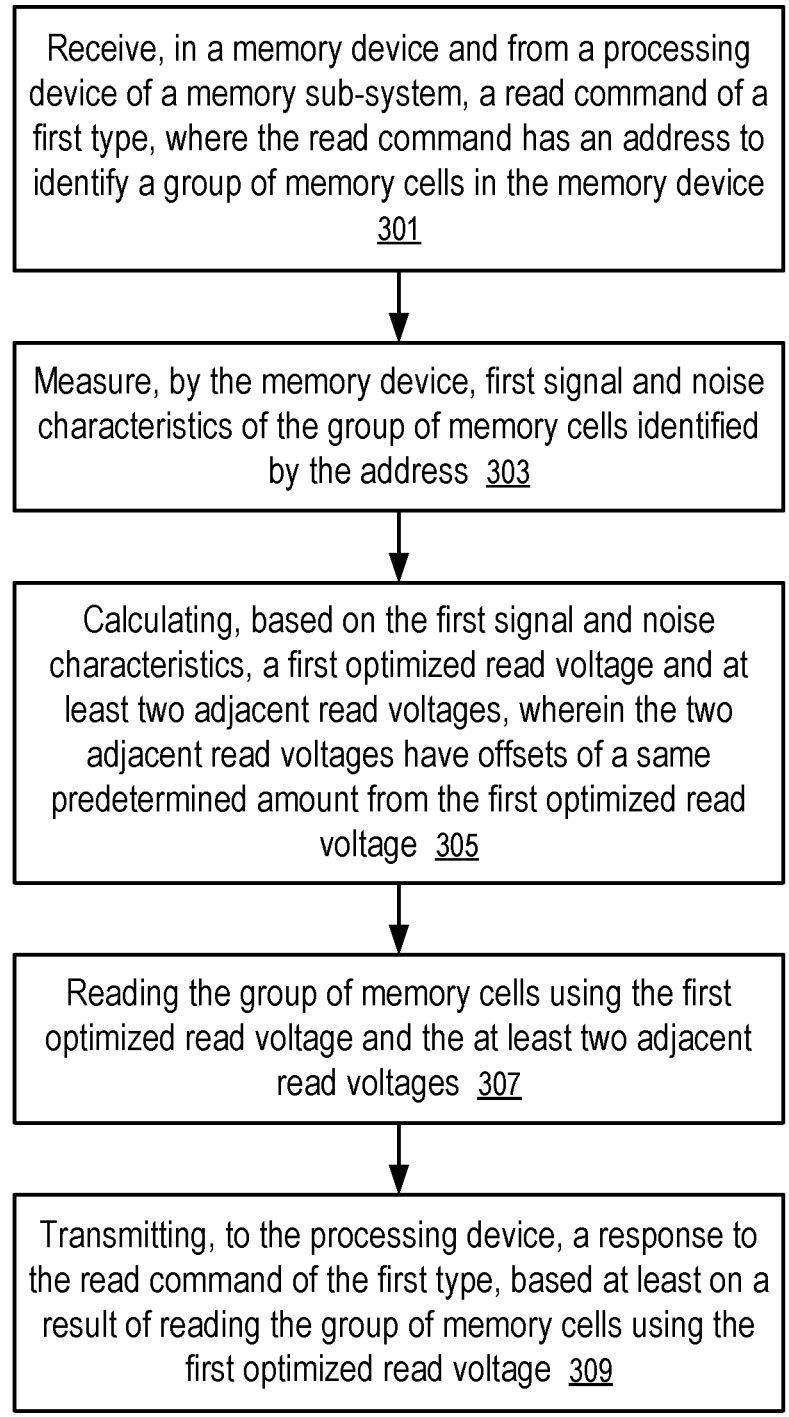
FIG. 5 shows a method to execute a read command according to one embodiment.

FIG. 5 shows a method to execute a read command according to one embodiment. The method of FIG. 5 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 5 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 5 can be implemented in a computing system of FIG. 1 with a memory device of FIG. 2 and signal noise characteristics illustrated in FIG. 3 with the operations illustrated in FIG. 4.

At block 301, a memory device 130 receives, from a processing device 117 of a memory sub-system 110, a read command 201 of a first type, where the read command 201 has an address 135 to identify a group of memory cells (e.g., 131 or 133) in the memory device 130.

At block 303, the memory device 130 measures (e.g., using its calibration circuit 145) first signal and noise characteristics 139 of the group of memory cells (e.g., 131 or 133) identified by the address 135.

At block 305, the memory device 130 calculates (e.g., using its calibration circuit 145), based on the first signal and noise characteristics 139, a first optimized read voltage 151 and at least two adjacent read voltages (e.g., 181 and 182, wherein the two adjacent read voltages 181 and 182 have offsets 183 and 184 of a same predetermined amount from the first optimized read voltage 151.

At block 307, the memory device 130 reads the group of memory cells (e.g., 131 or 133) using each of the first optimized read voltage 151 and the at least two adjacent read voltages (e.g., 181, 182; and/or 185, 186).

For example, the memory device 130 generates hard bit data 177 based on reading the group of memory cells (e.g., 131 or 133) using the first optimized read voltage 151. Further, the memory device 130 generates soft bit data 173 based on reading the group of memory cells using the two adjacent read voltages (e.g., 181 and 182; or 185 or 186) that have the offsets of the same predetermined amount from the first optimized read voltage 151.

For example, the soft bit data 173 can be generated based on an exclusive or (XOR) operation of the result obtained from reading the group of memory cells (e.g., 131) using one adjacent read voltage (e.g., 181) and the result obtained from reading the group of memory cells (e.g., 131) using the other adjacent read voltage (e.g., 182) that has the same amount of offset.

At block 309, the memory device 130 transmits, to the processing device 117, a response to the read command 201 of the first type, based at least on a result of reading the group of memory cells (e.g., 131 or 133) using the first optimized read voltage 151.

For example, the result can include the hard bit data 177 but optionally include soft bit data 173 based on a classification result 165 determined based on the first signal and noise characteristics 139 from which the read voltages 151, 181, 183 are calculated.

The memory device 130 can be configured to execute other types of read commands that does not require the measuring 303 of the signal and noise characteristics 139 of the group of memory cells (e.g., 131 or 133).

For example, in response to a read command of a second type having the same address to identify the group of memory cells (e.g., 131 or 133), the memory device 130 can: measure second signal and noise characteristics of the group of memory cells identified by the address 135; calculate a second optimized read voltage based on the second signal and noise characteristics (e.g., without calculating the adjacent voltages for reading soft bit data); and read the group of memory cells using the second optimized read voltage, without reading the group of memory cells using read voltages having offsets of the same predetermined amount from the second optimized read voltage. Thus, since the soft bit data is not read, the response to the read command of the second type cannot include soft bit data.

For example, in response to a read command of a third type having the same address to identify the group of memory cells (e.g., 131 or 133), the memory device 130 can generate a response based on a result of reading, using a first voltage, the group of memory cells without calibrating the first voltage by measuring signal and noise characteristics by the calibration circuit 145. Further the response to the read command of the third type is generated without reading the group of memory cells using second voltages that have offsets of the same predetermined amount from the first voltage. For example, the first voltage can be specified by the controller 115 of the memory sub-system 110; and no soft bit data is read for the read command of the third type.

During execution of the read command 201 of the first type, the memory device 130 can: determine, based on the first signal and noise characteristics 139, a classification result 165 indicative of an error rate in the hard bit data 177; and determine 167, based on the classification result 165, whether to transmit the soft bit data 173 to the processing device 117. For example, the determining of the classification result 165 can be performed in the memory device 130 in parallel with the reading 307 of the group of memory cells (e.g., 131 or 133) using the first optimized read voltage 151 and the at least two adjacent read voltages (e.g., 181 and 182; and/or 185 and 186).

If the memory device 130 decides not to transmit the soft bit data 173 as part of the response to the read command 201 of the first type, the memory device 130 can cache the soft bit data 173. Subsequently, the processing device 117 can generate a request for the soft bit data 173; and in response to the request, the memory device 130 can provide the soft bit data 173 without reading the group of memory cells (e.g., 131 or 133) in responding to the request.

A non-transitory computer storage medium can be used to store instructions of the firmware of a memory sub-system (e.g., 110). When the instructions are executed by the controller 115 and/or the processing device 117, the instructions cause the controller 115, the processing device 117, and/or a separate hardware module to perform the methods discussed above.

Figure 6:
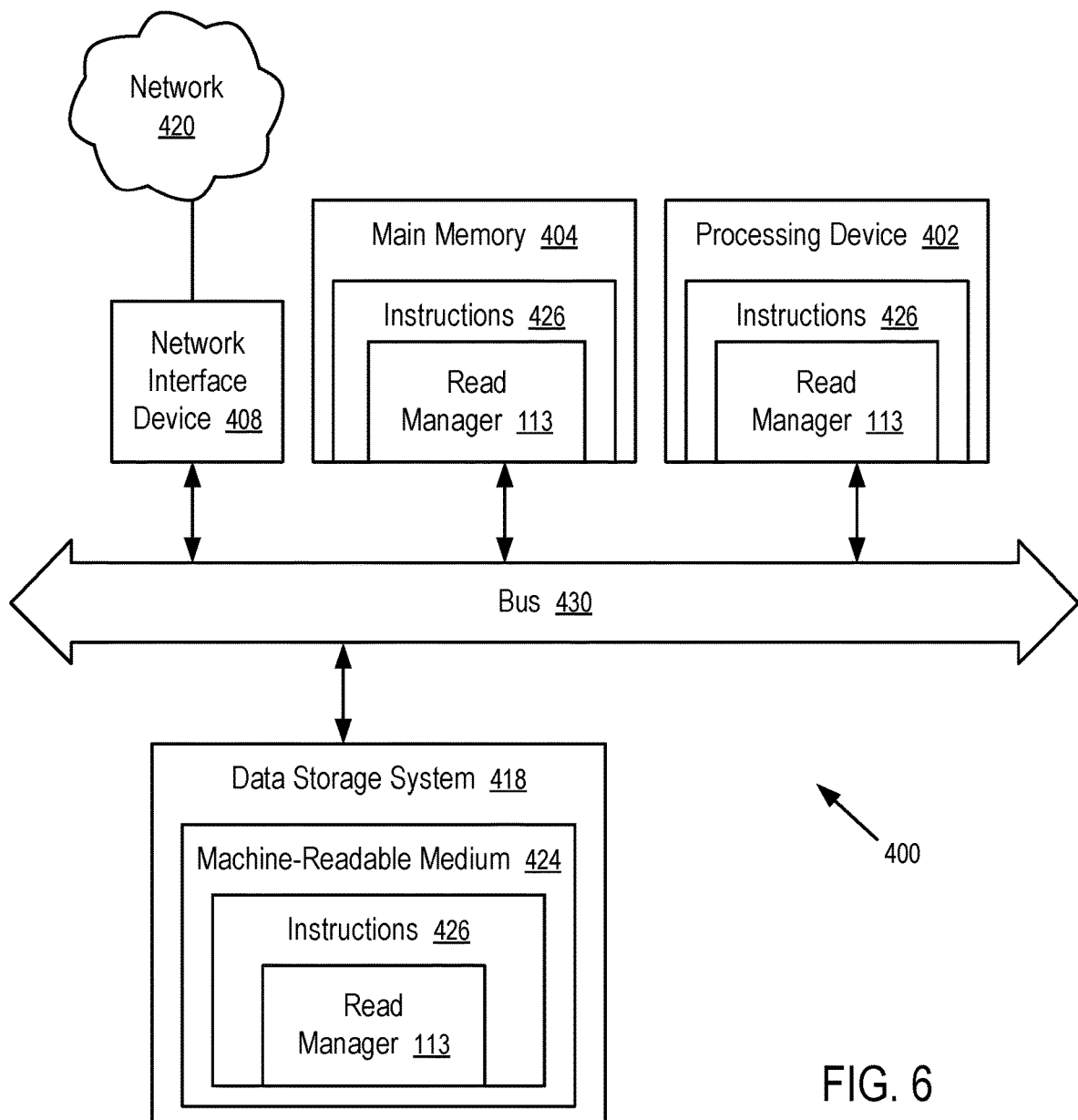
FIG. 6 is a block diagram of an example computer system in which embodiments of the present disclosure can operate.

FIG. 6 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a read manager 113 (e.g., to execute instructions to perform operations corresponding to the read manager 113 described with reference to FIGS. 1-5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a read manager 113 (e.g., the read manager 113 described with reference to FIGS. 1-5). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer.

Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory sub-system, comprising:
a processing device; and
at least one memory device, the memory device having:
a group of memory cells formed on an integrated circuit die; and
a calibration circuit configured to measure signal and noise characteristics of memory cells in the memory device;

wherein the processing device is configured to transmit a read command of a first type to the memory device, the read command including an address to identify the group of memory cells;

wherein in response to the read command of the first type, the memory device is configured to:
  measure, using the calibration circuit, first signal and noise characteristics of the group of memory cells identified by the address;
  calculate, based on the first signal and noise characteristics, a first optimized read voltage and at least two adjacent read voltages, wherein the two adjacent read voltages have offsets of a same predetermined amount from the first optimized read voltage;
  read the group of memory cells using the first optimized read voltage and the at least two adjacent read voltages; and
  transmit, to the processing device, a response to the read command of the first type, based at least on a result of reading the group of memory cells using the first optimized read voltage.

2. The memory sub-system of claim 1, wherein the processing device is configured to transmit a read command of a second type to the memory device, the read command of the second type including the address to identify the group of memory cells; and
  wherein in response to the read command of the second type, the memory device is configured to:
    measure, using the calibration circuit, second signal and noise characteristics of the group of memory cells identified by the address;
    calculate a second optimized read voltage based on the second signal and noise characteristics;
    read the group of memory cells using the second optimized read voltage, without reading the group of memory cells using read voltages having offsets of the same predetermined amount from the second optimized read voltage; and
    transmit, to the processing device, a response to the read command of the second type based on a result of reading the group of memory cells using the second optimized read voltage.

3. The memory sub-system of claim 2, wherein the processing device is configured to transmit a read command of a third type to the memory device, the read command of the third type including the address to identify the group of memory cells; and
  wherein in response to the read command of the third type, the memory device is configured to generate a response based on a result of reading the group of memory cells without using the calibration circuit.

4. The memory sub-system of claim 3, wherein the memory device is configured to respond to the read command of the third type based on reading the group of memory cells using a first voltage without reading the group of memory cells using second voltages that have offsets of the same predetermined amount from the first voltage.

5. The memory sub-system of claim 4, wherein during execution of the read command of the first type, the memory device is configured to:
  generate hard bit data based on reading the group of memory cells using the first optimized read voltage; and
  generate soft bit data based on reading the group of memory cells using the two adjacent read voltages having the offsets of the same predetermined amount from the first optimized read voltage.

6. The memory sub-system of claim 5, wherein the soft bit data is generated based on an exclusive or (XOR) operation of results obtained from reading the group of memory cells using the two adjacent read voltages.

7. The memory sub-system of claim 5, wherein the at least two adjacent read voltages include two additional read voltages;
  wherein the two additional read voltages having offsets of a same further amount from the first optimized read voltage, the same further amount being larger than the predetermined amount used to calculate the two adjacent read voltages;
  wherein the soft bit data is generated further based on reading the group of memory cells using the two additional read voltages.

8. The memory sub-system of claim 5, wherein during execution of the read command of the first type, the memory device is configured to:
  determine, based on the first signal and noise characteristics, a classification result indicative of an error rate in the hard bit data; and
  determine, based on the classification result, whether to transmit the soft bit data to the processing device.

9. The memory sub-system of claim 8, wherein the classification result is determined at least in part concurrently with reading of the group of memory cells using the first optimized read voltage and the at least two adjacent read voltages.

10. The memory sub-system of claim 8, wherein after the response to the read command of the first type is transmitted to the processing device, the processing device generates a request for the soft bit data; and
  wherein in response to the request, the memory device is configured to provide the soft bit data without reading the group of memory cells after the request.

11. The memory sub-system of claim 8, wherein the memory device is enclosed within an integrated circuit device.

12. A method, comprising:
  receiving, in a memory device and from a processing device of a memory sub-system, a read command of a first type, the read command including an address to identify a group of memory cells in the memory device; and
  in response to the read command of the first type,
    measuring, by the memory device, first signal and noise characteristics of the group of memory cells identified by the address;
    calculating, based on the first signal and noise characteristics, a first optimized read voltage and at least two adjacent read voltages, wherein the two adjacent read voltages have offsets of a same predetermined amount from the first optimized read voltage;
    reading the group of memory cells using the first optimized read voltage and the at least two adjacent read voltages; and
    transmitting, to the processing device, a response to the read command of the first type, based at least on a result of reading the group of memory cells using the first optimized read voltage.

13. The method of claim 12, further comprising:
  receiving, in the memory device, a read command of a second type, the read command of the second type including the address to identify the group of memory cells; and in response to the read command of the second type,
  measuring, by the memory device, second signal and noise characteristics of the group of memory cells identified by the address;
  calculating a second optimized read voltage based on the second signal and noise characteristics;
  reading the group of memory cells using the second optimized read voltage, without reading the group of memory cells using read voltages having offsets of the same predetermined amount from the second optimized read voltage; and
  transmitting, to the processing device, a response to the read command of the second type based on a result of reading the group of memory cells using the second optimized read voltage.

14. The method of claim 13, further comprising:
  receiving, in the memory device, a read command of a third type, the read command of the third type including the address to identify the group of memory cells; and
  in response to the read command of the third type, generating, by the memory device a response based on a result of reading, using a first voltage, the group of memory cells without using calibrating the first voltage by measuring signal and noise characteristics, without reading the group of memory cells using second voltages that have offsets of the same predetermined amount from the first voltage.

15. The method of claim 12, wherein during execution of the read command of the first type, the method further comprises:
  generating hard bit data based on reading the group of memory cells using the first optimized read voltage; and
  generating soft bit data based on reading the group of memory cells using the two adjacent read voltages having the offsets of the same predetermined amount from the first optimized read voltage, wherein the soft bit data is generated based on an exclusive or (XOR) operation of results obtained from reading the group of memory cells using the two adjacent read voltages.

16. The method of claim 15, wherein the at least two adjacent read voltages include two additional read voltages;
  wherein the two additional read voltages having offsets of a same further amount from the first optimized read voltage, the same further amount being larger than the predetermined amount used to calculate the two adjacent read voltages;
  wherein the soft bit data is generated further based on reading the group of memory cells using the two additional read voltages.

17. The method of claim 15, wherein during execution of the read command of the first type, the method further comprises:
  determining, based on the first signal and noise characteristics, a classification result indicative of an error rate in the hard bit data; and
  determining, based on the classification result, whether to transmit the soft bit data to the processing device;
  wherein the determining of the classification result is in parallel with the reading of the group of memory cells using the first optimized read voltage and the at least two adjacent read voltages.

18. The method of claim 17, wherein after the response to the read command of the first type is transmitted to the processing device, the processing device generates a request for the soft bit data; and the method further comprises:
  providing, by the memory device, the soft bit data without reading the group of memory cells after the request.

19. A memory device, comprising:
  an integrated circuit package enclosing the memory device; and
  a plurality of groups of memory cells formed on at least one integrated circuit die;
  wherein in response to a read command, the memory device is configured to,
    measure signal and noise characteristics of a group of memory cells identified by an address provided to the memory device for the read command;
    calculate, based on the signal and noise characteristics, a first voltage, a second voltage, and a third voltage, wherein an offset between the first voltage and the second voltage is equal to an offset between the second voltage and the third voltage;
    read the group of memory cells by applying the first voltage to obtain hard bit data;
    read the group of memory cells using the second voltage and the third voltage to obtain soft bit data; and
    transmitting, to the processing device, a response to the read command, the response including at least the hard bit data.

20. The memory device of claim 19, wherein in response to a read command, the memory device is further configured to,
  determine, based on the signal and noise characteristics, a classification indicative of an error rate in the hard bit data; and
  skipping, based on the classification, transmission of the soft bit data to the processing device in the response.

* * * * *